(12) United States Patent
Ozawa

(10) Patent No.: US 10,297,571 B2
(45) Date of Patent: May 21, 2019

(54) SEMICONDUCTOR PACKAGE

(71) Applicant: TOSHIBA MEMORY CORPORATION, Minato-ku (JP)

(72) Inventor: Isao Ozawa, Chigasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 76 days.

(21) Appl. No.: 14/162,062

(22) Filed: Jan. 23, 2014

(65) Prior Publication Data
US 2015/0069632 A1     Mar. 12, 2015

Related U.S. Application Data

(60) Provisional application No. 61/874,540, filed on Sep. 6, 2013.

(51) Int. Cl.
*H01L 25/03*     (2006.01)
*H01L 23/498*     (2006.01)
(Continued)

(52) U.S. Cl.
CPC .......... *H01L 25/03* (2013.01); *H01L 23/3128* (2013.01); *H01L 23/3135* (2013.01); *H01L 23/49838* (2013.01); *H01L 23/50* (2013.01); *H01L 23/5226* (2013.01); *H01L 25/18* (2013.01); *H01L 2224/32145* (2013.01);
(Continued)

(58) Field of Classification Search
CPC . H01L 25/03; H01L 23/3135; H01L 23/3128; H01L 23/49838; H01L 23/50; H01L 2224/32225; H01L 2924/19105; H01L 2224/48147; H01L 23/5226; H01L 2225/0651; H01L 2225/06506; H01L 25/18; H01L 2224/73265; H01L 2224/48145; H01L 2224/48091;
(Continued)

(56) References Cited

U.S. PATENT DOCUMENTS 6,359,340 B1 *   3/2002   Lin .................... H01L 25/0657
                                                            257/723
6,710,455 B2 *   3/2004   Goller .................... H01L 24/29
                                                            257/686
(Continued)

FOREIGN PATENT DOCUMENTS

CN             101120623 A      2/2008

OTHER PUBLICATIONS

U.S. Appl. No. 14/642,083, filed Mar. 9, 2015, Nagai, et al.

*Primary Examiner* — Su C Kim
(74) *Attorney, Agent, or Firm* — Oblon, McClelland, Maier & Neustadt, L.L.P.

(57) ABSTRACT

According to one embodiment, a semiconductor package includes a substrate with first and second pad, first semiconductor chip above the substrate, first wire, first mold member, second semiconductor chip above the first mold member, third semiconductor chip above the second semiconductor chip, second wire, and a second mold member. The first wire electrically connects the first pad and the first semiconductor chip. The first mold member seals the first wire and the first semiconductor chip. The second wire electrically connects the second pad and the second semiconductor chip. The second mold member seals the second wire, the second and the third semiconductor chips, and the first mold member.

14 Claims, 12 Drawing Sheets

(51) Int. Cl.
  *H01L 23/50* (2006.01)
  *H01L 23/31* (2006.01)
  *H01L 23/522* (2006.01)
  *H01L 25/18* (2006.01)

(52) U.S. Cl.
  CPC ............... *H01L 2224/32225* (2013.01); *H01L 2224/48091* (2013.01); *H01L 2224/48145* (2013.01); *H01L 2224/48147* (2013.01); *H01L 2224/73265* (2013.01); *H01L 2225/0651* (2013.01); *H01L 2225/06506* (2013.01); *H01L 2225/06562* (2013.01); *H01L 2924/15311* (2013.01); *H01L 2924/19105* (2013.01)

(58) Field of Classification Search
  CPC . H01L 2224/32145; H01L 2225/06562; H01L 2924/15311
  See application file for complete search history.

(56) References Cited

U.S. PATENT DOCUMENTS

| | | | |
|---|---|---|---|
| 7,239,164 B2 | 7/2007 | Tamaki | |
| 7,642,633 B2 | 1/2010 | Hirose et al. | |
| 7,994,643 B2 | 8/2011 | Kwon et al. | |
| 8,710,675 B2* | 4/2014 | Kim et al. | 257/777 |
| 2004/0227240 A1* | 11/2004 | Bolken et al. | 257/738 |
| 2005/0246389 A1* | 11/2005 | Shah | G06F 9/52 |
| 2007/0170573 A1* | 7/2007 | Kuroda et al. | 257/686 |
| 2007/0194454 A1 | 8/2007 | Hanawa et al. | |
| 2008/0211079 A1* | 9/2008 | Onodera | H01L 25/105 257/686 |
| 2010/0007014 A1 | 1/2010 | Suzuki et al. | |
| 2011/0175222 A1* | 7/2011 | Kim | H01L 23/16 257/738 |
| 2012/0317332 A1* | 12/2012 | Kwak | G06F 12/0246 711/102 |
| 2013/0015570 A1 | 1/2013 | Sato | |
| 2013/0015589 A1 | 1/2013 | Liao et al. | |
| 2013/0049221 A1* | 2/2013 | Han | H01L 23/3135 257/774 |
| 2013/0049228 A1* | 2/2013 | Nam | H01L 24/97 257/777 |
| 2013/0093101 A1 | 4/2013 | Saigusa et al. | |
| 2013/0200530 A1* | 8/2013 | Song | H01L 25/074 257/777 |

* cited by examiner

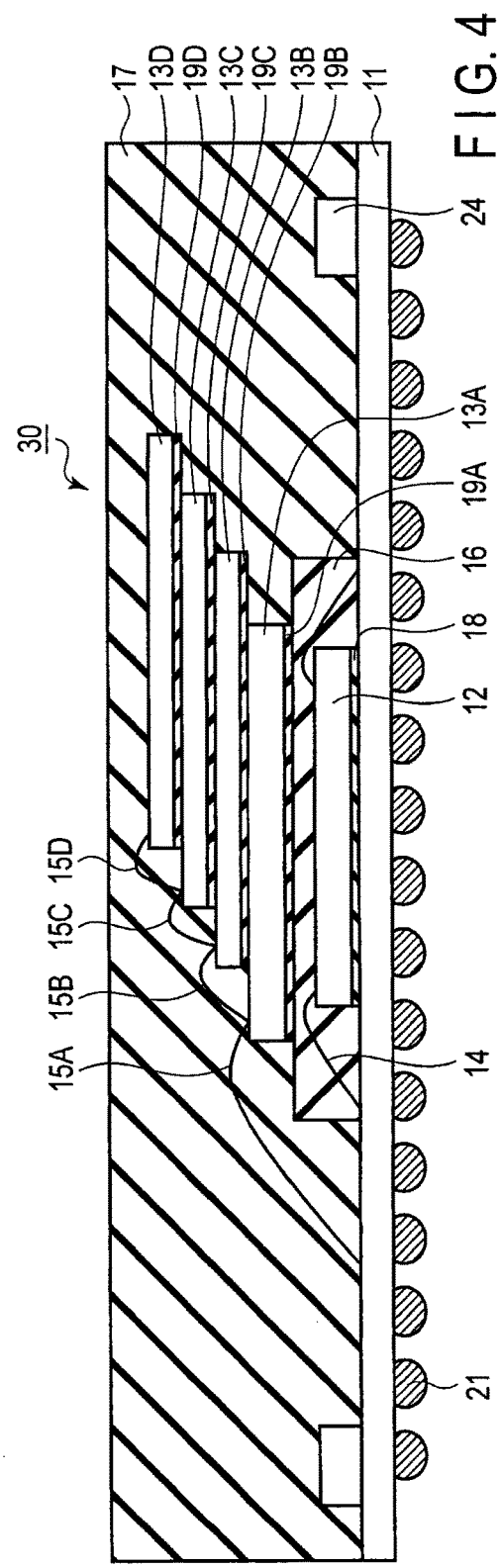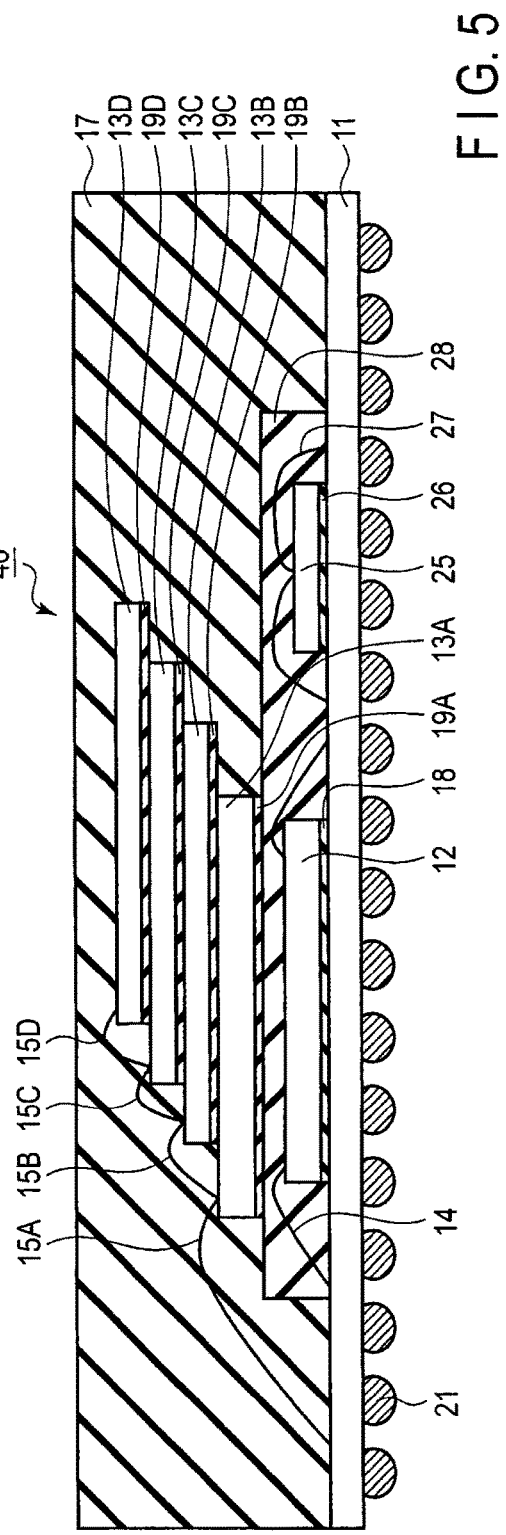

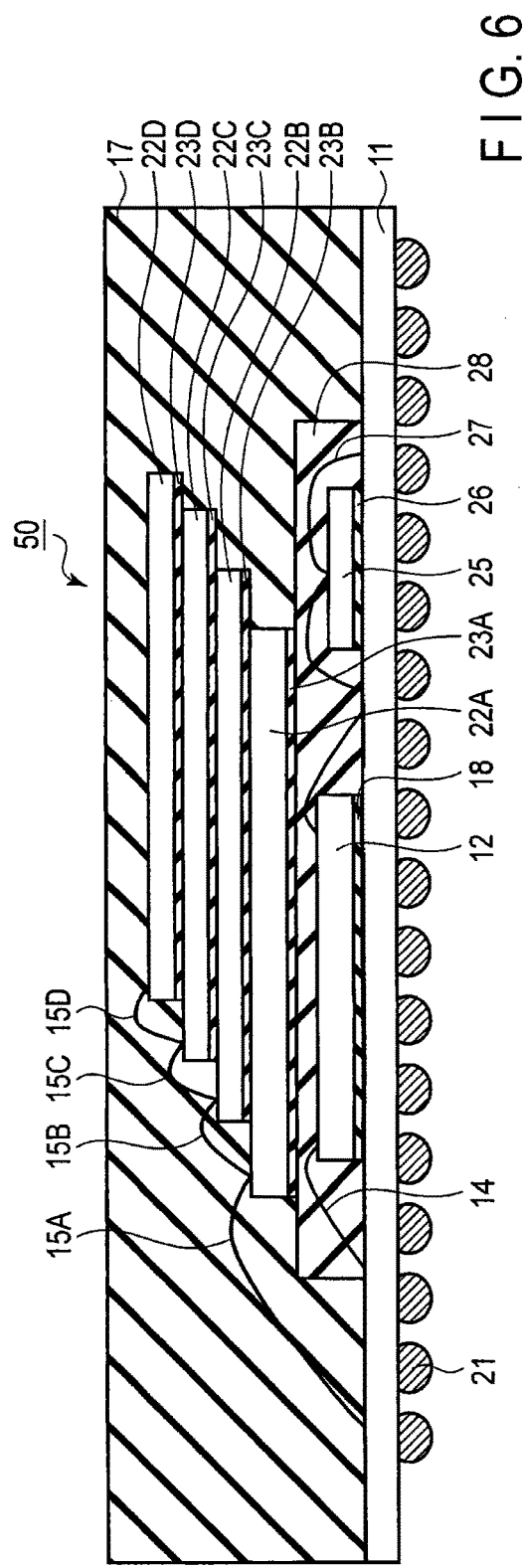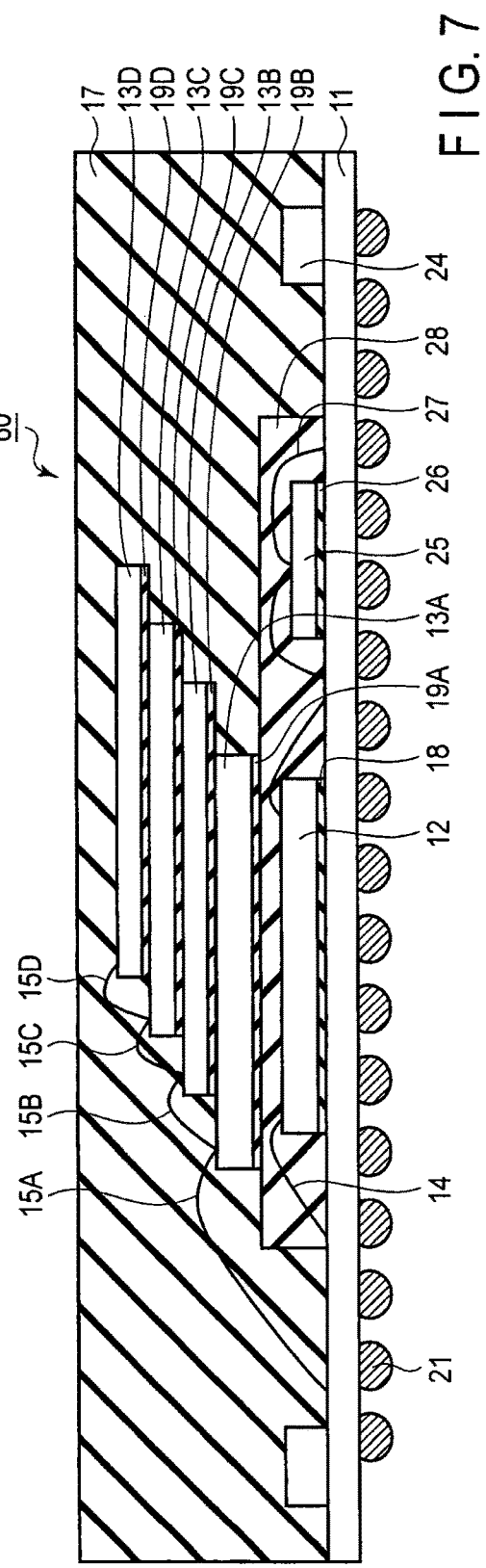

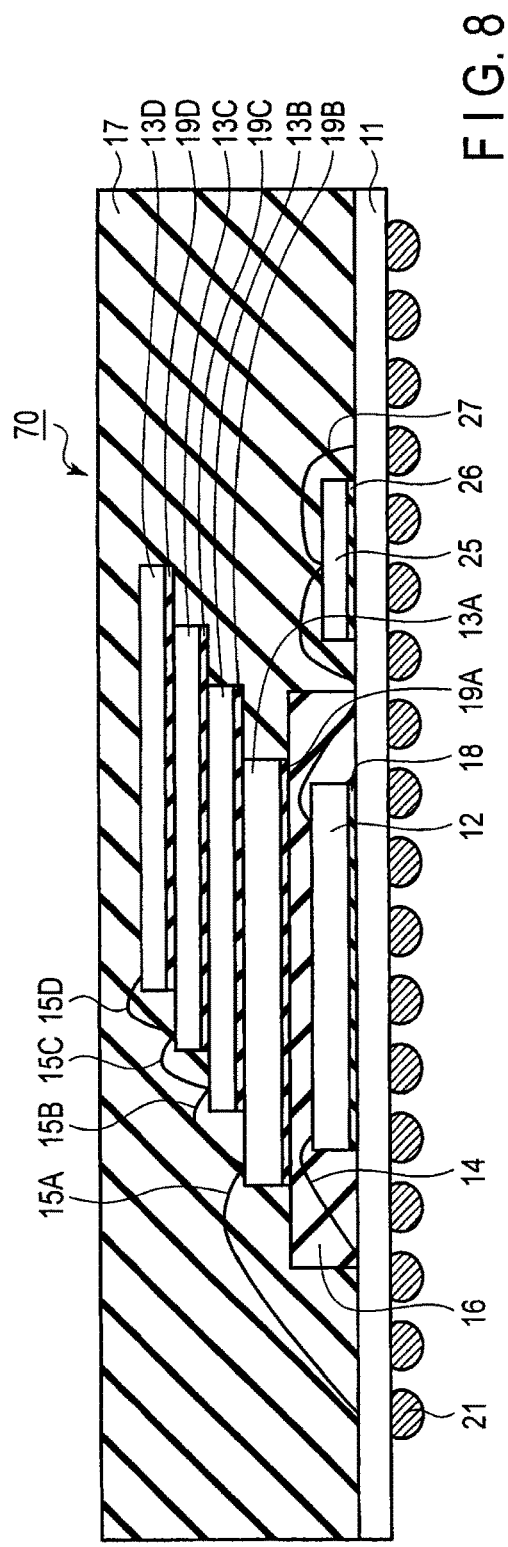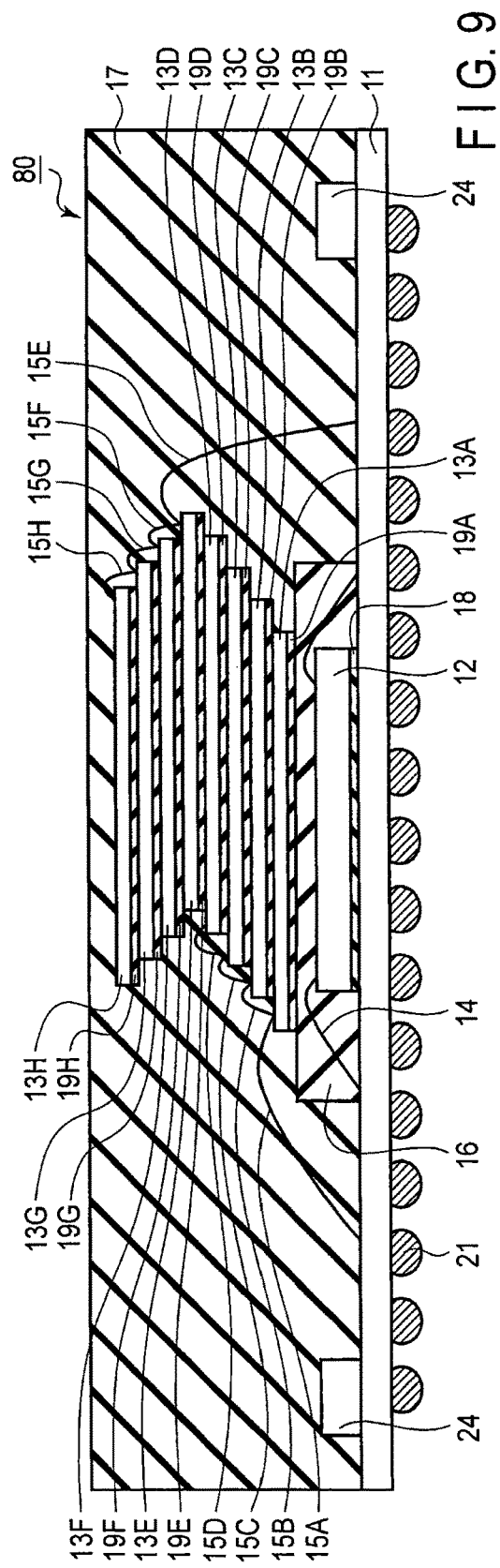

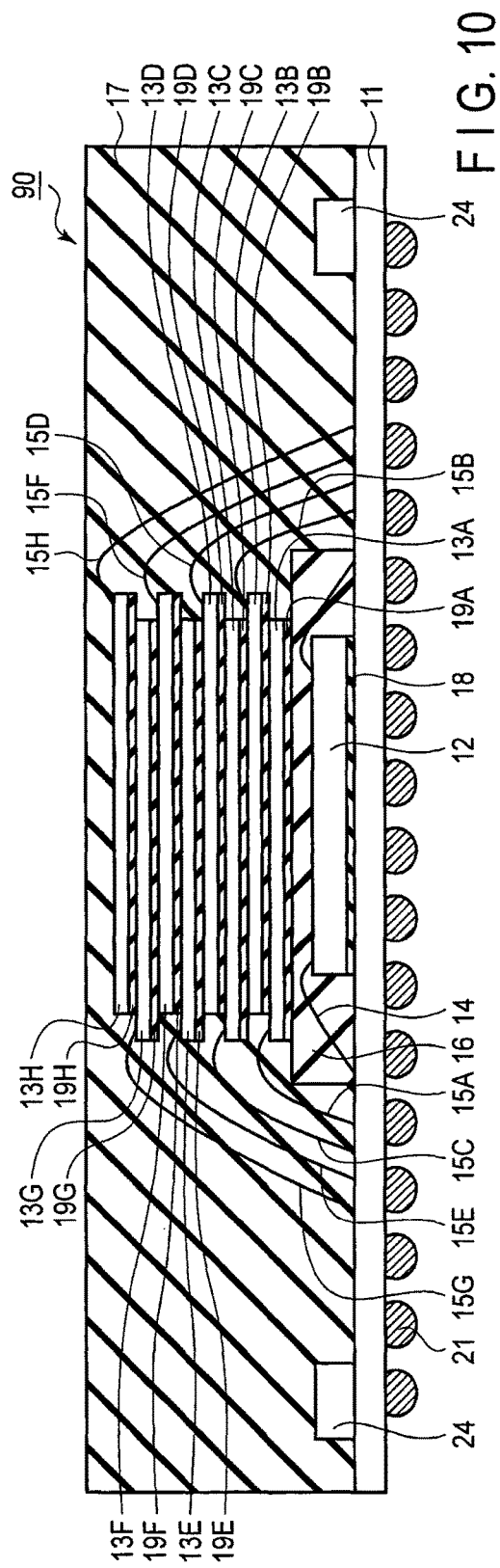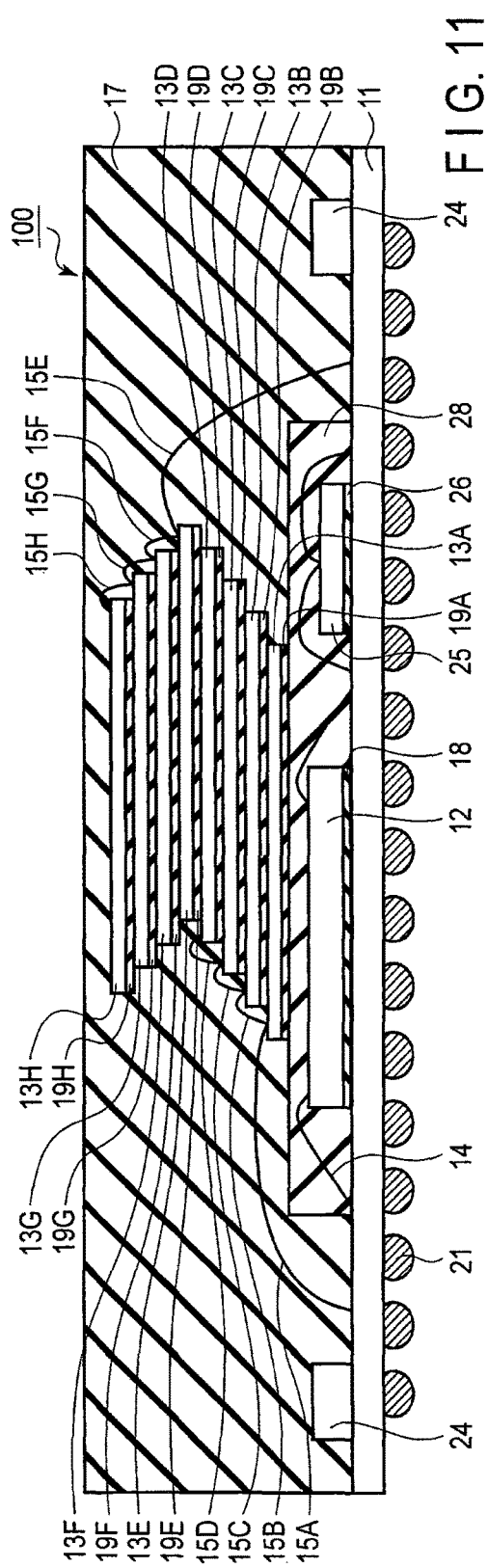

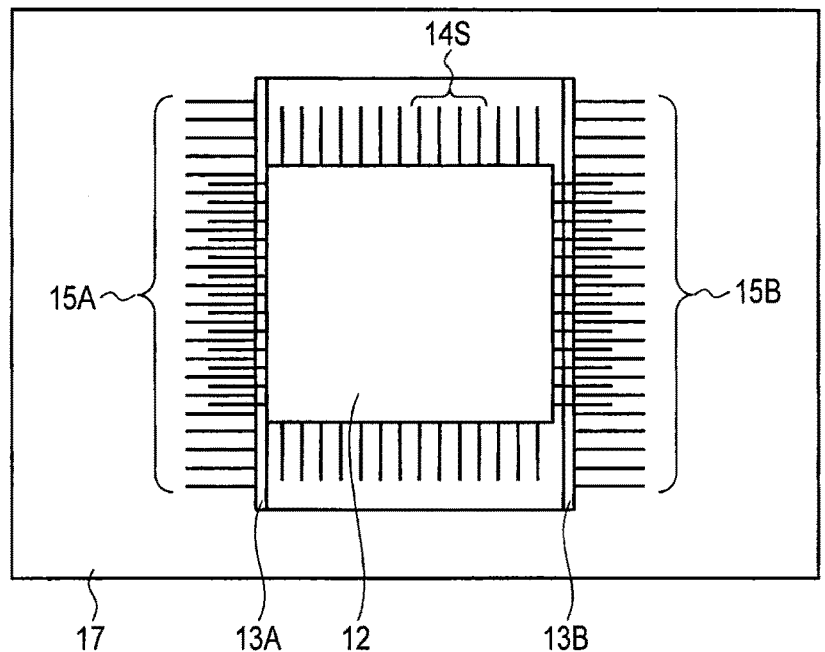
F I G. 13
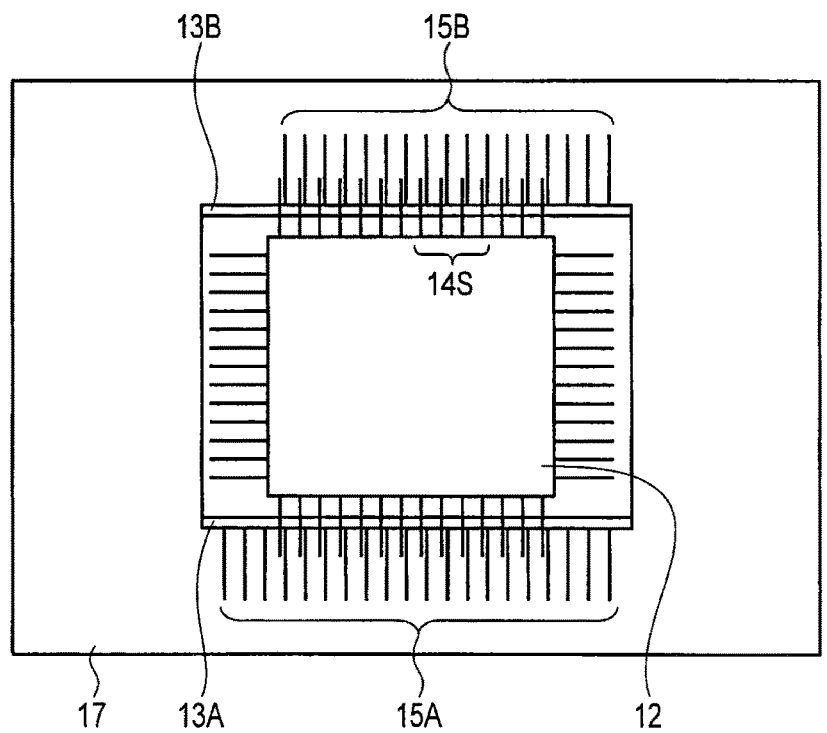
F I G. 14

SEMICONDUCTOR PACKAGE

CROSS-REFERENCE TO RELATED APPLICATIONS

This application claims the benefit of U.S. Provisional Application No. 61/874,540, filed Sep. 6, 2013, the entire contents of which are incorporated herein by reference.

FIELD

Embodiments described herein relate generally to a semiconductor package.

BACKGROUND

In recent years, a multi-chip package (MCP), in which a plurality of semiconductor chips are sealed in one package, is prevalently used mainly for electronic apparatuses such as portable apparatuses. For example, a semiconductor package of a mold type, in which a NAND flash memory and its controller are arranged on a substrate, and they are sealed by a mold member, is commercially available.

BRIEF DESCRIPTION OF THE DRAWINGS

FIG. 4 is a sectional view of the semiconductor package according to the second modification of the first embodiment.

FIG. 5 is a sectional view of a semiconductor package according to the second embodiment.

FIG. 6 is a sectional view of the semiconductor package according to the first modification of the second embodiment.

FIG. 7 is a sectional view of the semiconductor package according to the second modification of the second embodiment.

FIG. 8 is a sectional view of the semiconductor package according to the third modification of the second embodiment.

FIG. 9 is a sectional view of a semiconductor package according to the third embodiment.

FIG. 10 is a sectional view of the semiconductor package according to the first modification of the third embodiment.

FIG. 11 is a sectional view of the semiconductor package according to the second modification of the third embodiment.

FIG. 13 is a top view of a controller chip and NAND chips according to the fourth embodiment.

FIG. 14 is a top view of a controller chip and NAND chips according to a comparative example.

DETAILED DESCRIPTION

Figure 1:
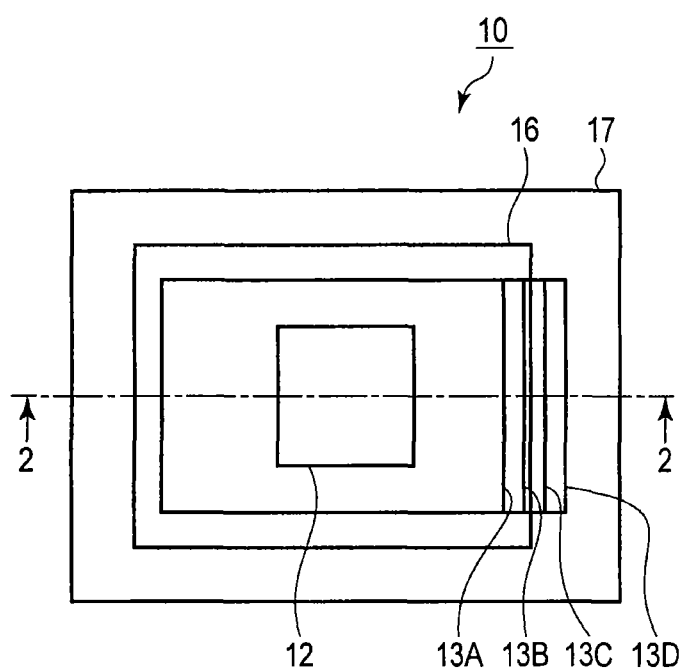
FIG. 1 is a plan view of a semiconductor package according to the first embodiment.

Embodiments of the present invention will be described hereinafter with reference to the drawings. In the following description, the same reference numerals denote components having the same functions and arrangements, and a repetitive description thereof will be given if necessary. Each of the following embodiments exemplifies an apparatus and method required to embody the technical idea of the embodiment, and materials, shapes, structures, layouts, and the like of components are not specified to those to be described hereinafter.

In general, according to one embodiment, a semiconductor package includes a substrate, a first semiconductor chip, a first wire, a first mold member, a second semiconductor chip, a third semiconductor chip, a second wire, and a second mold member. The substrate has a first pad and a second pad. The first semiconductor chip is arranged above the substrate. The first wire electrically connects the first pad and the first semiconductor chip. The first mold member seals the first wire and the first semiconductor chip above the substrate. The second semiconductor chip is arranged above the first mold member. The third semiconductor chip is arranged above the second semiconductor chip. The second wire electrically connects the second pad and the second semiconductor chip. The second mold member seals the second wire, the third semiconductor chip, the second semiconductor chip, and the first mold member on the substrate.

First Embodiment

Figure 2:
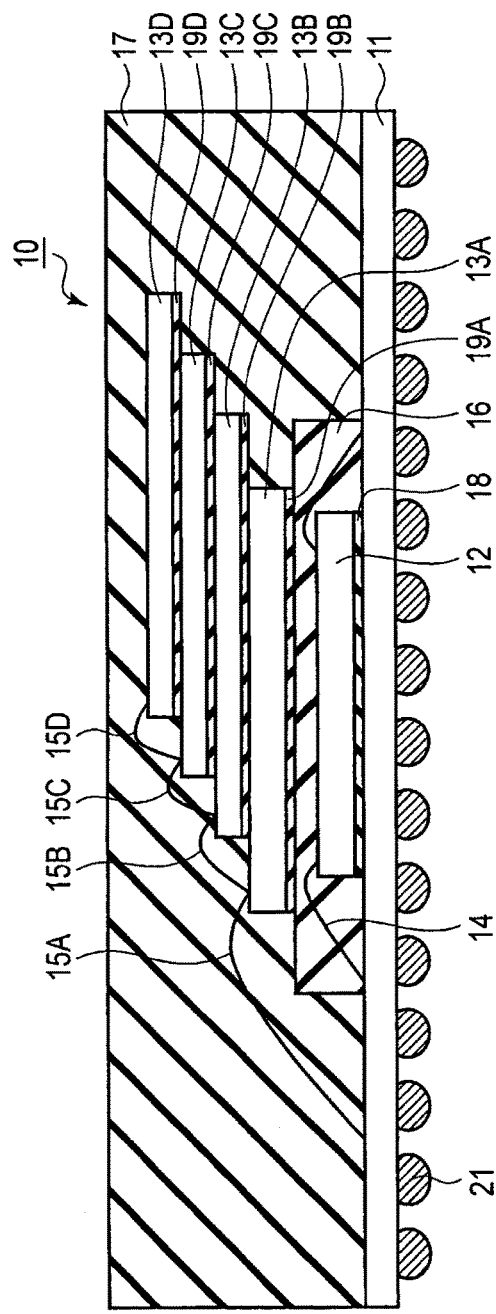
FIG. 2 is a sectional view taken along a line 2-2 of the semiconductor package shown in FIG. 1.

FIG. 1 is a plan view of a semiconductor package according to the first embodiment. FIG. 2 is a sectional view taken along a line 2-2 of the semiconductor package shown in FIG. 1.

A semiconductor package 10 includes a substrate 11, controller chip 12, NAND chips 13A, 13B, 13C, and 13D, wires 14, 15A, 15B, 15C, and 15D, mold members 16 and 17, mount films 18, 19A, 19B, 19C, and 19D, and solder balls 21. Note that FIG. 1 does not illustrate any wire. The NAND chips 13A to 13D are semiconductor chips formed with NAND flash memories. The controller chip 12 is a semiconductor chip formed with a controller used to control the operations of the NAND flash memories.

Each NAND flash memory may adopt either a Single-Level Cell (SLC) method for storing one bit in one cell or a Multi-Level Cell (MLC) method for storing two or more bits in one cell. An outer size of each of the NAND chips 13A, 13B, 13C, and 13D is, for example, 12×10 mm. An outer size of the controller chip 12 is, for example, 6×6 mm. The sizes of the NAND chips 13A, 13B, 13C, and 13D and the controller chip 12 are not limited to these sizes. The NAND chips 13A, 13B, 13C, and 13D may or may not have the same thickness.

The controller chip 12 is arranged above the substrate 11. The controller chip 12 is fixed above the substrate 11 with the mount film 18 therebetween. The wires 14 are bonded between pads of the controller chip 12 and those of the substrate 11. The wires 14 establish electrical connections between the pads of the controller chip 12 and those of the substrate 11. The pads of the controller chip 12 are arranged along, for example, four sides of the controller chip 12. For example, first, second, third, and fourth pad groups are respectively arranged along first, second, third, and fourth sides.

The mold member 16 which seals the controller chip 12 and wires 14 is formed on the substrate 11. By sealing the controller chip 12 and wires 14 above the substrate 11 by the mold member 16, the controller chip 12 and wires 14 are protected from an external stress, humidity, contaminant, and the like. A thick mount film may be used in place of the mold member 16. Then, a semiconductor package of a mold type (first mold package), which seals the controller chip 12, is formed.

The NAND chips 13A, 13B, 13C, and 13D are stacked above the mold member 16 while being shifted by a pad region in one end direction. That is, the NAND chip 13A is fixed above the mold member 16 with the mount film 19A therebetween. The NAND chip 13B is fixed above the NAND chip 13A with the mount film 19B therebetween. The NAND chip 13C is fixed above the NAND chip 13B with the mount film 19C therebetween. Furthermore, the NAND chip 13D is fixed above the NAND chip 13C with the mount film 19D therebetween.

The wires 15A are bonded between pads of the NAND chip 13A and those of the substrate 11. The pads of the NAND chip 13A are arranged along, for example, only one side of the NAND chip 13A. The wires 15A establish electrical connections between the pads of the NAND chip 13A and those of the substrate 11. The wires 15B are bonded between pads of the NAND chip 13B and those of the NAND chip 13A. The pads of the NAND chip 13B are arranged along, for example, only one side on the same side of the pads of the NAND chip 13A. The wires 15B establish electrical connections between the pads of the NAND chip 13B and those of the NAND chip 13A.

The wires 15C are bonded between pads of the NAND chip 13C and those of the NAND chip 13B. The pads of the NAND chip 13C are arranged along, for example, only one side on the same side of the pads of the NAND chip 13B. The wires 15C establish electrical connections between the pads of the NAND chip 13C and those of the NAND chip 13B. Furthermore, the wires 15D are bonded between pads of the NAND chip 13D and those of the NAND chip 13C. The pads of the NAND chip 13D are arranged along, for example, only one side on the same side of the pads of the NAND chip 13C. The wires 15D establish electrical connections between the pads of the NAND chip 13D and those of the NAND chip 13C.

The mold member 17 which seals the mold member 16, NAND chips 13A to 13D, and wires 15A to 15D is formed on the substrate 11. By sealing the NAND chips 13A to 13D and wires 15A to 15D above the substrate 11 by the mold member 17, the NAND chips 13A to 13D and wires 15A to 15D can be protected from an external stress, humidity, contaminant, and the like. Furthermore, on a back surface of the substrate 11, which surface is opposite to the surface on which the mold member 17 is formed, the solder balls 21 for external connections are formed. Then, a semiconductor package of a mold type (second mold package), which seals the NAND chips 13A to 13D, is formed.

As the substrate 11, a multi-layered wiring substrate is used as needed. The mold members 16 and 17 may be a resin containing the same material or resins containing different materials. As the mold member 16, a resin for potting is used. As the mold member 17, a resin for transfer molding is used. When the resin for potting is used, a frame which surrounds an outer shape of a mold member to be molded may be arranged, and a resin may be ejected into the frame. By ejecting the resin by arranging the frame, flatness of a central portion of the mold member can be maintained while preventing the resin from broadly flowing to end portions. The mold members 16 and 17 may be molded using a metal mold. The metal mold is preferably used since flatness of an upper surface of each mold member can be maintained. The mold member 17 may be molded by compression molding.

The semiconductor package 10 of the first embodiment has a structure in which the controller chip 12 above the substrate 11 is sealed by the mold member 16, and the stacked NAND chips 13A to 13D above the mold member 16 are sealed by the mold member 17. By arranging the stacked NAND chips 13A to 13D above the controller chip 12 in this way, an outer size of the semiconductor package can be reduced compared to a case in which the controller chip 12 and NAND chips 13A to 13D are arranged above the same plane. Note that when the pads of the controller chip 12 are arranged along the four sides, since it is difficult to directly stack the NAND chips above the controller chip 12, it is more desirable to adopt the structure of the semiconductor package of this embodiment.

Figure 3:
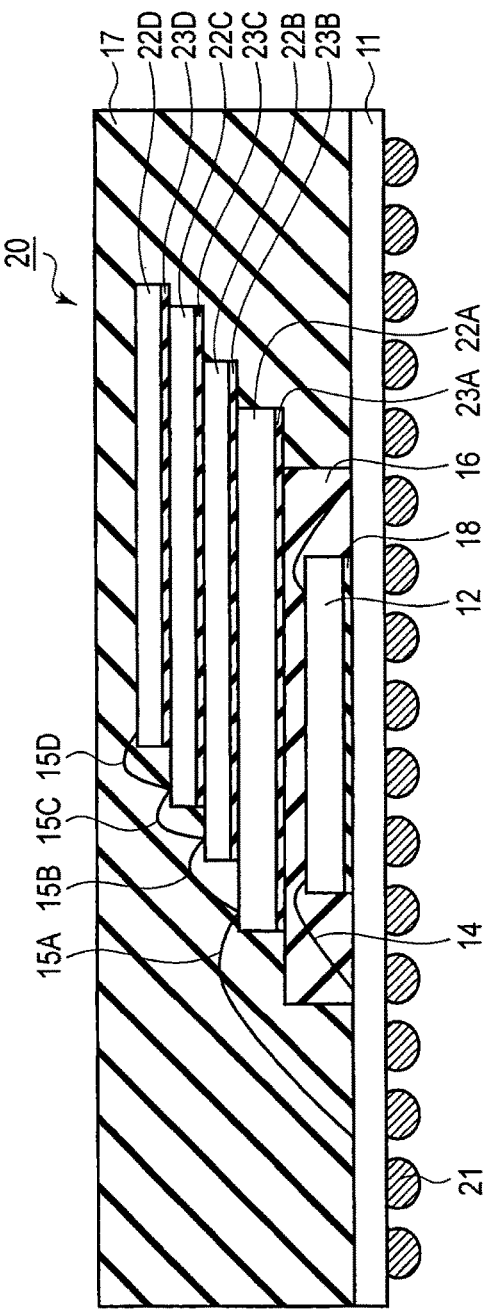
FIG. 3 is a sectional view of the semiconductor package according to the first modification of the first embodiment.

FIG. 3 is a sectional view showing the structure of a semiconductor package according to the first modification of the first embodiment.

A semiconductor package 20 further includes NAND chips 22A, 22B, 22C, and 22D having an outer size larger than the NAND chips 13A, 13B, 13C, and 13D, and mount films 23A, 23B, 23C, and 23D. On the mold member 16, the NAND chips 22A, 22B, 22C, and 22D are stacked. Note that the outer size of the controller chip 12 may be nearly equal to that of the NAND chips 22A to 22D, or the outer size of the NAND chips 22A to 22D may be larger than that of the controller chip 12.

The NAND chip 22A is fixed above the mold member 16 with the mount film 23A therebetween. The NAND chip 22B is fixed above the NAND chip 22A by the mount film 23B. The NAND chip 22C is fixed above the NAND chip 22B with the mount film 23C therebetween. Furthermore, the NAND chip 22D is fixed above the NAND chip 22C with the mount film 23D therebetween. The NAND chips 22A to 22D protrude from the side surface of the mold member 16, as shown in FIG. 3. In other words, in a section which cuts the substrate 11, controller chip 12, NAND chips 22A to 22D, and mold members 16 and 17, the NAND chips 22A to 22D protrude from the mold member 16. Other arrangements and effects are the same as those of the semiconductor package shown in FIG. 2.

Note that only some NAND chips (upper two NAND chips 13C and 13D) may protrude from the side surface of the mold member 16 like in the first embodiment, or all the NAND chips 22A to 22D may protrude from the side surface of the mold member 16 like in the first modification, or none of the NAND chips 13A to 13D or 22A to 22D may protrude from the side surface of the mold member 16. Such arrangement is determined according to the outer size of the NAND chips 13A to 13D or 22A to 22D, that of the controller chip 12, and the like.

FIG. 4 is a sectional view showing the structure of a semiconductor package according to the second modification of the first embodiment.

A semiconductor package 30 further includes electronic components 24 arranged on the substrate 11. The electronic components 24 on the substrate 11 are sealed by the mold member 17. The electronic components 24 include an oscillator, temperature sensor, EEPROM, chip resistor, chip capacitor, and the like. The electronic components 24 are connected to the controller chip 12, NAND chips 13A to 13D, and the like via wires included in a surface layer or inner layer of the substrate 11. Other arrangements and effects are the same as those of the semiconductor package shown in FIG. 2.

Second Embodiment

The second embodiment will explain an example in which a controller chip and DRAM chip above the substrate 11 are sealed with a mold member therebetween, and NAND chips above the mold member are further sealed by a mold member.

FIG. 5 is a sectional view showing the structure of a semiconductor package according to the second embodiment.

A semiconductor package 40 further includes a DRAM chip 25, mount film 26, wires 27, and mold member 28. The DRAM chip 25 is a semiconductor chip formed with a DRAM (Dynamic Random Access Memory). Note that an SRAM (Static Random Access Memory), MRAM (Magnetoresistive Random Access Memory), or the like may be formed in place of the DRAM. An outer size of the DRAM chip 25 is smaller than, for example, the NAND chips 13A to 13D and controller chip 12. However, the outer size of the DRAM chip 25 may be larger than the NAND chips 13A to 13D and controller chip 12 depending on a required DRAM capacity.

The controller chip 12 and DRAM chip 25 are arranged above the substrate 11. The controller chip 12 is fixed above the substrate 11 with the mount film 18 therebetween. The wires 14 are bonded between the pads of the controller chip 12 and those of the substrate 11. The DRAM chip 25 is fixed above the substrate 11 with the mount film 26 therebetween. The wires 27 are bonded between the pads of the DRAM chip 25 and those of the substrate 11. The pads of the DRAM chip 25 are arranged along, for example, a central line of the chip (center pads). The wires 27 establish electrical connections between the pads of the DRAM 25 and those of the substrate 11.

The mold member 28, which seals the controller chip 12, DRAM chip 25, and wires 14 and 27, is formed on the substrate 11. By sealing the controller chip 12, DRAM chip 25, and wires 14 and 27 above the substrate 11 with the mold member 28 therebetween, the controller chip 12, DRAM chip 25, and wires 14 and 27 can be protected from an external stress, humidity, contaminant, and the like. Then, a semiconductor package of a mold type (first mold package), which seals the controller chip 12 and DRAM chip 25, is formed.

The NAND chips 13A, 13B, 13C, and 13D are stacked above the mold member 28. The NAND chip 13A is fixed above the mold member 28 with the mount film 19A therebetween. The NAND chip 13B is fixed above the NAND chip 13A with the mount film 19B therebetween. The NAND chip 13C is fixed above the NAND chip 13B with the mount film 19C therebetween. Furthermore, the NAND chip 13D is fixed above the NAND chip 13C with the mount film 19D therebetween.

The wires 15A are bonded between pads of the NAND chip 13A and those of the substrate 11. The wires 15B are bonded between pads of the NAND chip 13B and those of the NAND chip 13A. The wires 15C are bonded between pads of the NAND chip 13C and those of the NAND chip 13B. Furthermore, the wires 15D are bonded between pads of the NAND chip 13D and those of the NAND chip 13C.

The mold member 17, which seals the mold member 28, NAND chips 13A to 13D, and wires 15A to 15D, is formed on the substrate 11. By sealing the NAND chips 13A to 13D and wires 15A to 15D above the substrate 11 by the mold member 17, the NAND chips 13A to 13D and wires 15A to 15D can be protected from an external stress, humidity, contaminant, and the like. Furthermore, on a back surface of the substrate 11, which surface is opposite to the surface on which the mold member 17 is formed, the solder balls 21 for external connections are formed. Then, a semiconductor package of a mold type, (second mold package), which seals the NAND chips 13A to 13D, is formed.

The semiconductor package 40 of the second embodiment has a structure in which the controller chip 12 and DRAM chip 25 above the substrate 11 are sealed by the mold member 28, and the stacked NAND chips 13A to 13D above the mold member 28 are sealed by the mold member 17. Even when the DRAM chip 25 is arranged above the substrate 11, since the stacked NAND chips 13A to 13D are arranged above the controller chip 12, an outer size of the semiconductor package can be reduced. Other arrangements and effects are the same as those in the first modification shown in FIG. 2. Note that when the pads of the DRAM chip 25 are arranged along the central line (center pads), since it is difficult to directly stack the NAND chips 13A to 13D above the DRAM chip 25, it is more desirable to adopt the structure of the semiconductor package of this embodiment.

FIG. 6 is a sectional view showing the structure of a semiconductor package according to the first modification of the second embodiment.

A semiconductor package 50 further includes NAND chips 22A, 22B, 22C, and 22D having an outer size larger than the NAND chips 13A, 13B, 13C, and 13D, and mount films 23A, 23B, 23C, and 23D. On the mold member 28, the NAND chips 22A to 22D are stacked. The NAND chips 22A to 22D overlap toward a position above the DRAM chip 25, as shown in FIG. 6. Other arrangements and effects are the same as those of the second embodiment shown in FIG. 5.

FIG. 7 is a sectional view showing the structure of a semiconductor package according to the second modification of the second embodiment.

A semiconductor package 60 further includes electronic components 24 arranged on the substrate 11. The electronic components 24 on the substrate 11 are sealed by the mold member 17. The electronic components 24 include an oscillator, temperature sensor, EEPROM, resistor, capacitor, and the like. Other arrangements and effects are the same as those of the second embodiment shown in FIG. 5.

FIG. 8 is a sectional view showing the structure of a semiconductor package according to the third modification of the second embodiment. In the second embodiment shown in FIG. 5, the controller chip 12 and DRAM chip 25 are sealed by the single mold member 28. However, in the third modification, the DRAM chip 25 is sealed not by the mold member 28 but by the mold member 17.

The controller chip 12 and DRAM chip 25 are arranged above the substrate 11. The controller chip 12 is fixed above the substrate 11 with the mount film 18 therebetween. The DRAM chip 25 is fixed above the substrate 11 with the mount film 26 therebetween. Furthermore, the mold member 17, which seals the controller chip 12 and wires 14, is formed on the substrate 11.

The NAND chips 13A to 13D are stacked above the mold member 16. On the substrate 11, the mold member 17 which seals the mold member 16, NAND chips 13A to 13D, DRAM chip 25, and wires 15A to 15D and 27, is formed. By sealing the NAND chips 13A to 13D, DRAM chip 25, and wires 15A to 15D and 27 above the substrate 11 by the mold member 17, the NAND chips 13A to 13D, DRAM chip 25, and wires 15A to 15D and 27 can be protected from an external stress, humidity, contaminant, and the like.

The semiconductor package 70 of the third modification has a structure in which the controller chip 12 above the substrate 11 is sealed by the mold member 16, and the stacked NAND chips 13A to 13D above the mold member 16, and the DRAM chip 25 are further sealed by the mold member 17.

Even when the DRAM chip 25 is arranged above the substrate 11 in this way, since the stacked NAND chips 13A to 13D are arranged above the controller chip 12, an outer size of the semiconductor package can be reduced. Other arrangements and effects are the same as those of the second embodiment shown in FIG. 5.

Third Embodiment

The third embodiment will explain an example in which a larger number of NAND chips are stacked above a mold member, and are sealed by another mold member.

FIG. 9 is a sectional view showing the structure of a semiconductor package according to the third embodiment.

A semiconductor package 80 further includes NAND chips 13E, 13F, 13G, and 13H, mount films 19E, 19F, 19G, and 19H, and wires 15E, 15F, 15G, and 15H.

On the mold member 16, the NAND chips 13A to 13D are stacked while being shifted respectively by a pad region in a first direction. Furthermore, the NAND chips 13E to 13H are stacked above the NAND chip 13D while being shifted respectively by a pad region in a second direction opposite to the first direction. In other words, in a section which cuts the substrate 11, the NAND chips 13A to 13H, mold member 16, and mold member 17, the NAND chips 13A to 13D are arranged while being shifted by a pad region in the first direction of the section, and the NAND chips 13E to 13H are arranged while being shifted by a pad region in the second direction.

The NAND chip 13E is fixed above the NAND chip 13D with the mount film 19E therebetween. The NAND chip 13F is fixed above the NAND chip 13E with the mount film 19F therebetween. The NAND chip 13G is fixed above the NAND chip 13F with the mount film 19G therebetween. The NAND chip 13H is fixed above the NAND chip 13G with the mount film 19H therebetween. Furthermore, electronic components 24 are arranged on the substrate 11.

The wires 15E are bonded between pads of the NAND chip 13E and those of the substrate 11. The wires 15E establish electrical connections between the pads of the NAND chip 13E and those of the substrate 11. The wires 15F are bonded between pads of the NAND chip 13F and those of the NAND chip 13E. The wires 15F establish electrical connections between the pads of the NAND chips 13F and 13E.

The wires 15G are bonded between pads of the NAND chip 13G and those of the NAND chip 13F. The wires 15G establish electrical connections between the pads of the NAND chips 13G and 13F. Furthermore, the wires 15H are bonded between pads of the NAND chip 13H and those of the NAND chip 13G. The wires 15H establish electrical connections between the pads of the NAND chips 13H and 13G.

On the substrate 11, the mold member 17, which seals the mold member 16, NAND chips 13A to 13H, wires 15A to 15H, and electronic components 24, is formed. By sealing the NAND chips 13A to 13H, wires 15A to 15H, and electronic components 24 above the substrate 11 by the mold member 17, the NAND chips 13A to 13H, wires 15A to 15H, and electronic components 24 can be protected from an external stress, humidity, contaminant, and the like. Furthermore, on a back surface of the substrate 11, solder balls 21 for external connections are formed. Then, a semiconductor package of a mold type (mold package) is formed. Other arrangements and effects are the same as those of the first embodiment shown in FIG. 2. Note that in order to maintain a low-profile structure of the semiconductor package, the thickness of a semiconductor substrate of each of the NAND chips 13A to 13H can be reduced.

FIG. 10 is a sectional view showing the structure of a semiconductor package according to the first modification of the third embodiment. A semiconductor package 90 of the first modification corresponds to another example in which a larger number of NAND chips are stacked above a mold member, and are sealed by another mold member, and has a different stacking pattern of the NAND chips from the structure shown in FIG. 9.

On the mold member 16, the NAND chips 13A to 13H are stacked while being shifted by a pad region alternately in the first direction and the second direction opposite to the first direction. In other words, in a section which cuts the substrate 11, NAND chips 13A to 13H, and mold members 16 and 17, the NAND chips 13A to 13H are arranged while being shifted by a pad region respectively in the first and second directions of the section.

The wires 15A are bonded between pads of the NAND chip 13A and those of the substrate 11. The wires 15A establish electrical connections between the pads of the NAND chip 13A and those of the substrate 11. The wires 15B are bonded between pads of the NAND chip 13B and those of the substrate 11. The wires 15B establish electrical connections between the pads of the NAND chip 13B and those of the substrate 11.

The wires 15C are bonded between pads of the NAND chip 13C and those of the substrate 11. The wires 15C establish electrical connections between the pads of the NAND chip 13C and those of the substrate 11. The wires 15D are bonded between pads of the NAND chip 13D and those of the substrate 11. The wires 15D establish electrical connections between the pads of the NAND chip 13D and those of the substrate 11.

The wires 15E are bonded between pads of the NAND chip 13E and those of the substrate 11. The wires 15E establish electrical connections between the pads of the NAND chip 13E and those of the substrate 11. The wires 15F are bonded between pads of the NAND chip 13F and those of the substrate 11. The wires 15F establish electrical connections between the pads of the NAND chip 13F and those of the substrate 11.

The wires 15G are bonded between pads of the NAND chip 13G and those of the substrate 11. The wires 15G establish electrical connections between the pads of the NAND chip 13G and those of the substrate 11. Furthermore, the wires 15H are bonded between pads of the NAND chip 13H and those of the substrate 11. The wires 15H establish electrical connections between the pads of the NAND chip 13H and those of the substrate 11.

On the substrate 11, the mold member 17, which seals the mold member 16, the NAND chips 13A to 13H, wires 15A to 15H, and electronic components 24, is formed. By sealing the NAND chips 13A to 13H, wires 15A to 15H, and electronic components 24 above the substrate 11 by the mold member 17, the NAND chips 13A to 13H, wires 15A to 15H, and electronic components 24 can be protected from an external stress, humidity, contaminant, and the like. Then, a semiconductor package of a mold type (mold package) is formed. Other arrangements and effects are the same as those of the first embodiment shown in FIG. 2.

FIG. 11 is a sectional view showing the structure of a semiconductor package according to the second modification of the third embodiment. A semiconductor package 100 of the second modification corresponds to an example in which the controller chip and DRAM chip above the substrate 11 are sealed by the mold member 28, and a larger number of NAND chips are stacked above the mold member 28.

On the substrate 11, a controller chip 12 and DRAM chip 25 are arranged. The controller chip 12 is fixed above the substrate 11 with the mount film 18 therebetween. The DRAM chip 25 is fixed above the substrate 11 with the mount film 26 therebetween.

Furthermore, on the substrate 11, the mold member 28, which seals the controller chip 12, DRAM chip 25, and wires 14 and 27, is formed. By sealing the controller chip 12, DRAM chip 25, and wires 14 and 27 above the substrate 11 by the mold member 28, the controller chip 12, DRAM chip 25, and wires 14 and 27 can be protected from an external stress, humidity, contaminant, and the like.

On the mold member 28, the NAND chips 13A to 13D are stacked while being shifted respectively by a pad region in the first direction. Furthermore, above the NAND chip 13D, the NAND chips 13E to 13H are stacked while being shifted respectively by a pad region in the second direction.

On the substrate 11, the mold member 17, which seals the mold member 28, NAND chips 13A to 13H, wires 15A to 15H, and electronic components 24, is formed. By sealing the NAND chips 13A to 13H, wires 15A to 15H, and electronic components 24 above the substrate 11 by the mold member 17, the NAND chips 13A to 13H, wires 15A to 15H, and electronic components 24 can be protected from an external stress, humidity, contaminant, and the like. Furthermore, on a back surface of the substrate 11, the solder balls 21 for external connections are formed. Other arrangements and effects are the same as those in the third embodiment shown in FIG. 9.

Figure 12:
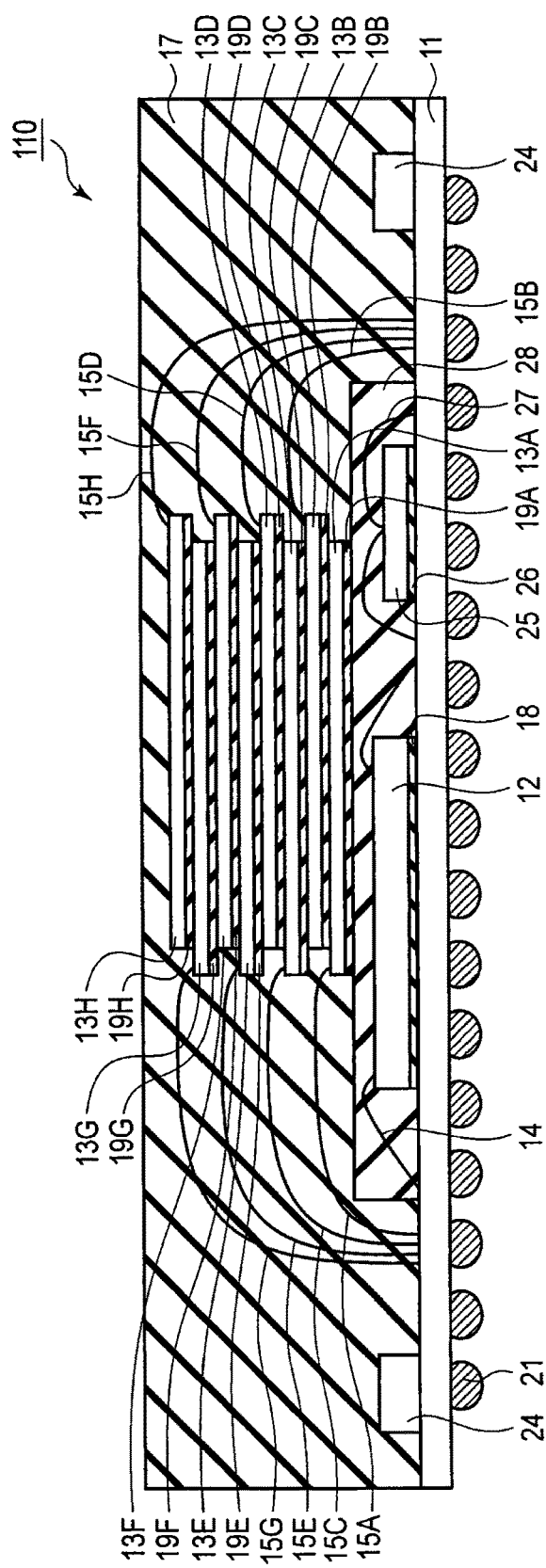
FIG. 12 is a sectional view of the semiconductor package according to the third modification of the third embodiment.

FIG. 12 is a sectional view showing the structure of a semiconductor package according to the third modification of the third embodiment. A semiconductor package 110 of the third modification corresponds to another example in which the controller chip and DRAM chip above the substrate 11 are sealed by the mold member 28, and a larger number of NAND chips are stacked above the mold member 28, and has a different stacking pattern of the NAND chips.

On the substrate 11, the controller chip 12 and DRAM chip 25 are arranged. The controller chip 12 is fixed above the substrate 11 with the mount film 18 therebetween. The DRAM chip 25 is fixed above the substrate 11 with the mount film 26 therebetween.

Furthermore, on the substrate 11, the mold member 28, which seals the controller chip 12, DRAM chip 25, and wires 14 and 27, is formed.

On the mold member 28, the NAND chips 13A to 13H are stacked while being shifted by a pad region alternately in the first and second directions.

On the substrate 11, the mold member 17, which seals the mold member 28, NAND chips 13A to 13H, wires 15A to 15H, and electronic components 24, is formed. By sealing the NAND chips 13A to 13H, wires 15A to 15H, and electronic components 24 above the substrate 11 by the mold member 17, the NAND chips 13A to 13H, wires 15A to 15H, and electronic components 24 can be protected from an external stress, humidity, contaminant, and the like. Then, a semiconductor package of a mold type (mold package) is formed. Other arrangements and effects are the same as those in the first modification shown in FIG. 10.

Fourth Embodiment

The fourth embodiment will explain an example when signals compliant with the SATA (Serial Advanced Technology Attachment) standard (to be referred to as SATA signals hereinafter) are transmitted between the controller chip 12 and substrate 11 in the first to third embodiments via wires, the influence of noise on the SATA signals is reduced. Furthermore, a terminal layout of a semiconductor package of the embodiment will be described. Note that the same arrangement as the terminal layout of the semiconductor package of this embodiment is applicable to signals compliant with high-speed interface standards, and the present invention is not limited to the SATA standard. For example, the arrangement of this embodiment may be applied to a case in which signals compliant with the SAS (Serial Attached Small computer system interface) standard, PCIe (Peripheral Component Interconnect express) standard, and the like are transmitted.

FIG. 13 is a top view of a controller chip and NAND chips according to the fourth embodiment. Also, FIG. 14 is a top view of a controller chip and NAND chips of a comparative example.

As shown in FIG. 14, wires 14S used to transmit SATA signals are arranged at one end of the controller chip 12. On a mold member which seals the controller chip 12, NAND chips 13A and 13B are stacked. On one end of the NAND chip 13B, wires 15B used to transmit signals are arranged.

In this manner, when the wires 14S and 15B are arranged at the same end side, they overlap each other, and signals flowing through the wires 15B superpose noise on SATA signals flowing through the wires 14S.

Hence, in the fourth embodiment, as shown in FIG. 13, the position of the wires 15B of the NAND chip 13B is rotated through 90 degrees so as to prevent at least the wires 14S and 15B from overlapping each other. That is, the wires 15A and 15B of the NAND chips 13A and 13B are arranged so as not to overlap the wires 14S of the controller chip 12. Thus, the influence of noise on SATA signals flowing through the wires 14S can be reduced.

Note that this example is effective when the wires of the NAND chips are bonded at two opposing ends or one end.

Also, the substrate 11 of the semiconductor package of each of the first to third embodiments takes a measure so as to prevent other signals from giving noise to SATA signal transmission paths. This measure will be described below.

Figure 15:
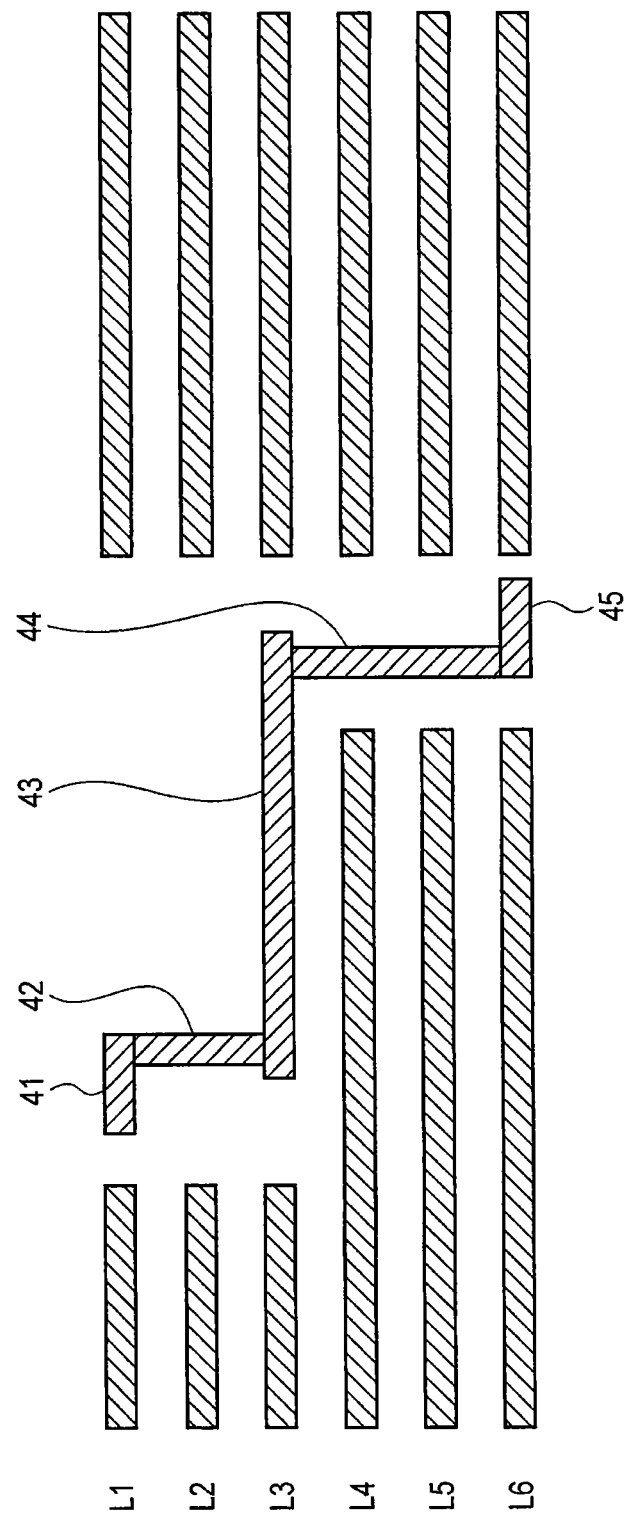
FIG. 15 is a schematic sectional view showing wiring layers of SATA signals in a substrate according to the embodiment.

FIG. 15 is a schematic sectional view showing wiring layers of SATA signals in the substrate 11. Assume that the substrate 11 is a multi-layered substrate having six wiring layers.

A wiring 41 including each pad of the substrate 11 is connected to the corresponding pad of the controller chip via a wire. The wiring 41 is formed in a first wiring layer L1. The wiring 41 is connected to a wiring 43 of a third wiring layer L3 via a contact member 42. The wiring 43 is connected to a wiring 45 of a sixth wiring layer L6 via a contact member 44. Furthermore, the wiring 45 is connected to the solder ball 21.

On a transmission path defined by the wiring 41, contact member 42, wiring 43, contact member 44, and wiring 45, a SATA signal is transmitted. Thus, wiring layers above or below the wirings 41, 43, and 45 are formed as ground potential layers. Then, the wirings 41, 43, and 45 are shielded by the ground potential layers. Also, no pattern is formed on the wiring layers above or below the wirings 41, 43, and 45. With this measure, the influence of noise given to the SATA signal on the transmission path is reduced.

Figure 16A:
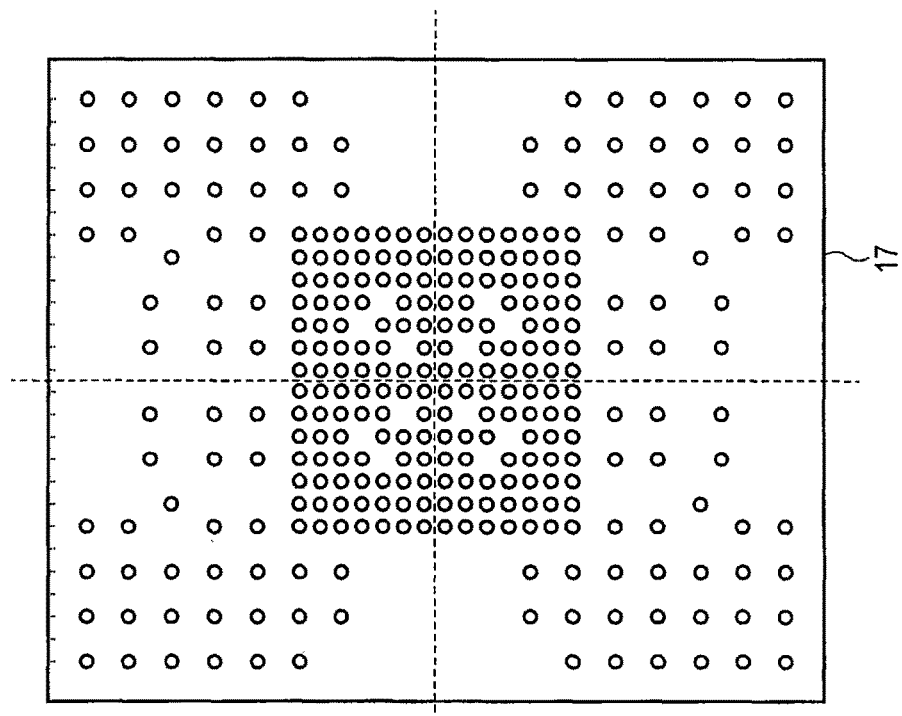
FIG. 16A is a bottom view showing arrays of solder balls in the semiconductor package according to the embodiment.
Figure 16B:
FIG. 16B is a side view of the semiconductor package according to the embodiment.
Figure 16C:
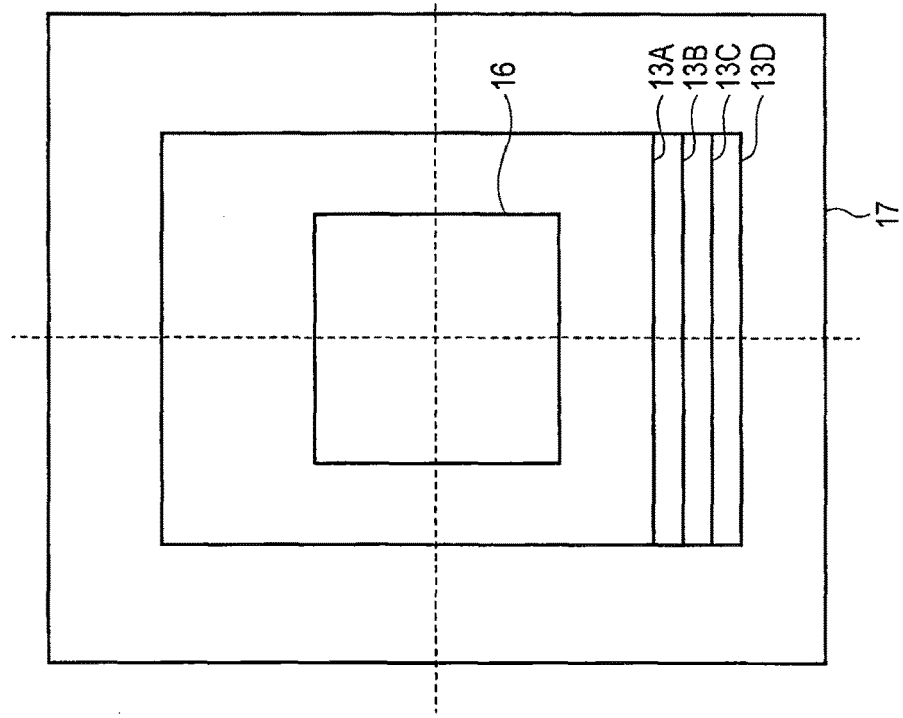
FIG. 16C is a top view of the semiconductor package shown in FIG. 2.

FIG. 16A is a bottom view showing arrays of the solder balls in the semiconductor package according to the first to third embodiments. FIG. 16B is a side view of the semiconductor package, and FIG. 16C is a top view of the semiconductor package shown in FIG. 2.

Figure 17:
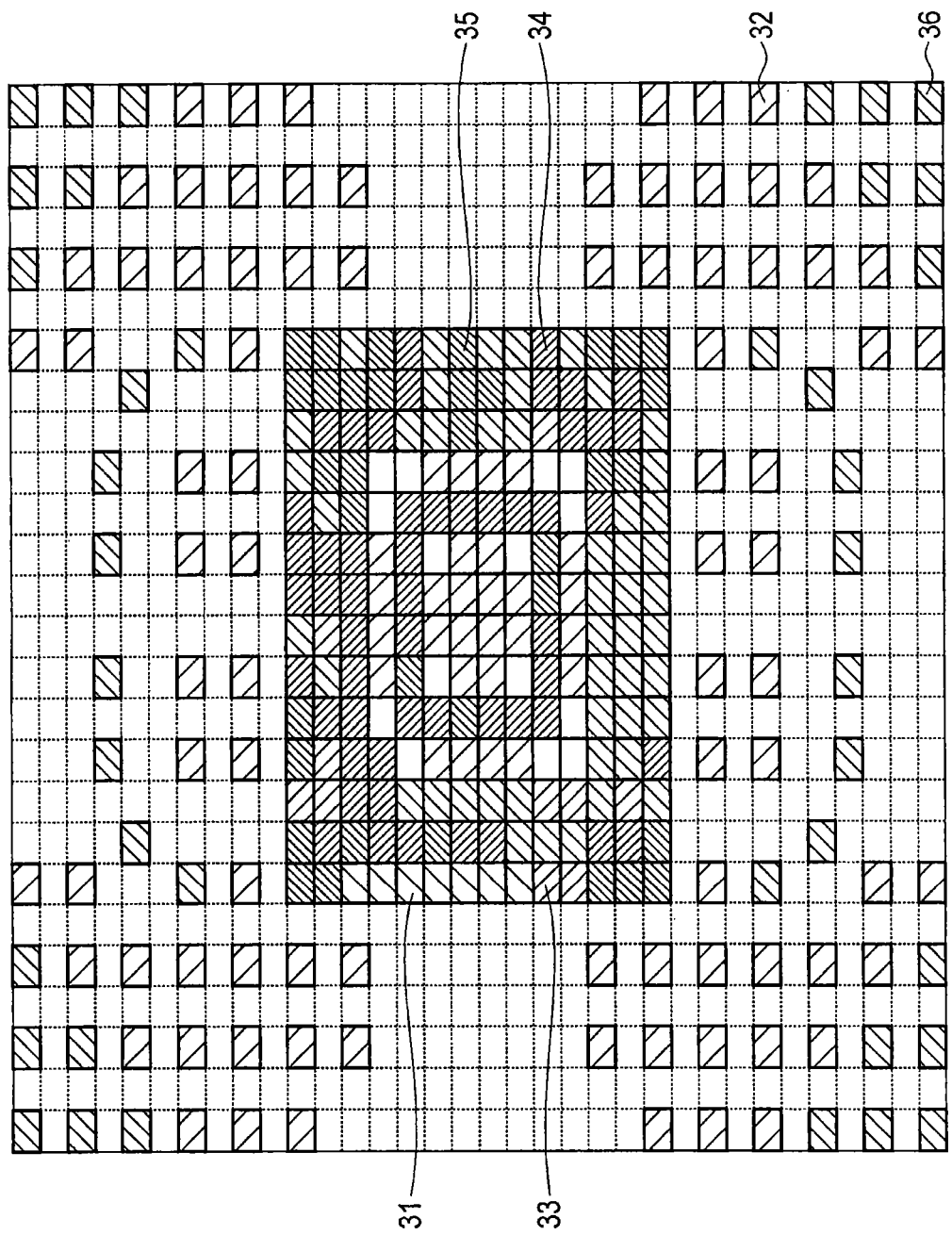
FIG. 17 is a schematic view of arrays of solder balls in the semiconductor package according to the embodiment.

As shown in FIG. 16A, the solder balls 21 are arrayed on the back surface of the substrate 11. FIG. 17 schematically illustrates assignments of these solder balls 21. Note that the ball arrays shown in FIG. 17 are compliant with the JEDEC standard.

Assignments indicated by regions 31 shown in FIG. 17 correspond to solder balls used to input/output SATA signals. Assignments indicated by regions 32 correspond to thermal balls used to dissipate heat generated in the semiconductor package. Assignments indicated by regions 33 correspond to solder balls used to input/output signals, and those indicated by regions 34 correspond to solder balls to which various power source voltages are supplied. Furthermore, assignments indicated by regions 35 correspond to solder balls to which a reference voltage (for example, a ground potential) is supplied, and those indicated by regions 36 correspond to non-connected, dummy, or external connection-inhibited solder balls.

In the ball arrays shown in FIG. 17, many thermal balls are arranged since heat dissipation is required in the semiconductor package. Also, the number of balls for power source voltages is increased so that a current flowing through one ball does not exceed an allowable value according to a current amount supplied to the semiconductor package.

Fifth Embodiment

The semiconductor package according to each of the first to fourth embodiment adopts, for example, a ball grid array (BGA) as a solid state drive (SSD). The semiconductor package is mounted in an electronic apparatus such as a personal computer, server, mobile phone, or the like. The fifth embodiment will explain an example of an electronic apparatus which mounts the semiconductor package.

Figure 18:
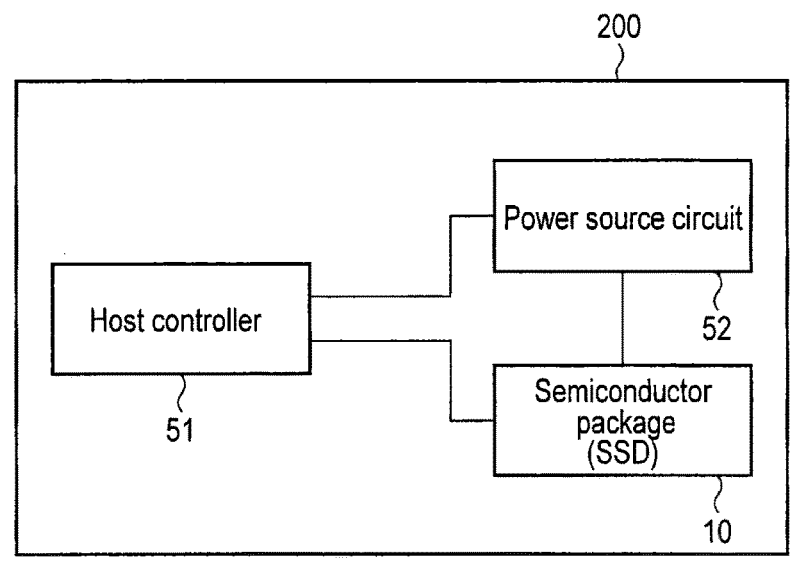
FIG. 18 is a block diagram showing an electronic apparatus having the semiconductor package according to the embodiment.

FIG. 18 is a block diagram showing the arrangement of an electronic apparatus including the semiconductor package.

An electronic apparatus 200 includes a semiconductor package (SSD in this embodiment) 10, host controller 51, and power source circuit 52. The semiconductor package 10 includes an SSD, and functions as a storage device in the electronic apparatus 200. The power source circuit 52 supplies various power source voltages required for the electronic apparatus 200 to operate to the host controller 51 and semiconductor package 10. The host controller 51 controls the operation of the electronic apparatus 200 including the semiconductor package 10 and power source circuit 52. The host controller 51 includes, for example, a south bridge, which exchanges SATA signals and the like between itself and the semiconductor package 10.

Figure 19:
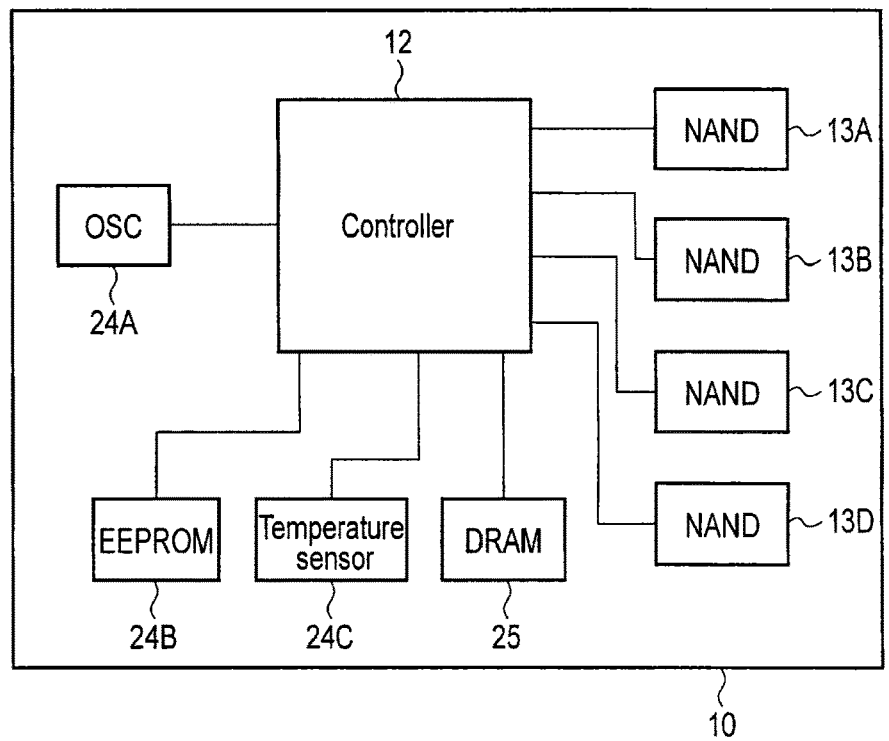
FIG. 19 is a block diagram showing the arrangement of the semiconductor package.

FIG. 19 is a block diagram showing the arrangement of the semiconductor package 10. Here, FIG. 19 shows the arrangement of an SSD.

The semiconductor package 10 includes the controller chip 12, NAND chips 13A to 13D, DRAM chip 25, OSC (Oscillator) 24A, EEPROM (Electrically Erasable and Programmable ROM) 24B, and temperature sensor 24C.

The NAND chips (NAND flash memories) 13A to 13D are nonvolatile memories, and store data even in a nonpower supply state. The DRAM chip 25 is used as a storage of management information of the NAND chips 13A to 13D, a data cache, and the like. The OSC (Oscillator) 24A supplies an operation signal of a predetermined frequency to the controller. The EEPROM 24B stores a control program and the like as fixed information. The temperature sensor 24C detects a temperature inside the semiconductor package 10, and notifies the controller of the detected temperature. The controller 12 controls the operations of the respective units in the semiconductor package 10. For example, the controller 12 controls the operations of the respective units using temperature information received from the temperature sensor 24C.

Note that the above embodiments and modifications have exemplified a mold type package sealed using a mold member as a semiconductor package. Alternatively, the present invention is also applicable to other packages such as a ceramic package sealed using a ceramic member.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor package comprising:
   a substrate comprising a first pad group and a second pad group;
   a first semiconductor chip above the substrate;
   a second semiconductor chip above the substrate, the second semiconductor chip comprising a dynamic random access memory;
   a first wire group configured to electrically connect the first pad group and the first semiconductor chip;
   a first mold member configured to seal the first wire group, the first semiconductor chip, and the second semiconductor chip;
   an electronic component above the substrate;
   a third semiconductor chip above the first mold member;
   a fourth semiconductor chip above the third semiconductor chip;
   a second wire group configured to electrically connect the second pad group and the third semiconductor chip; and
   a second mold member configured to seal the electronic component, the second wire group, the third semiconductor chip, the fourth semiconductor chip, and the first mold member; wherein:
   the third semiconductor chip and the fourth semiconductor chip comprise a nonvolatile memory;
   the first semiconductor chip comprises a controller of the nonvolatile memory;
   the first semiconductor chip comprises four sides connected to the first wire group;
   the four sides comprise at least a first side and a second side;

the first wire group comprises first wires and second wires;

the first wires are connected to the first side of the first semiconductor chip and transmit a signal between the substrate and the controller via high-speed interface standards;

the second wires are connected to the second side of the first semiconductor chip and extend in a same direction as the second wire group; and the first wires and the second wire group are configured not to overlap each other when viewed from a top view.

2. The semiconductor package according to claim 1, further comprising:

a third wire group configured to electrically connect the fourth semiconductor chip and a third pad group above the substrate, the third wire group being sealed in the second mold member.

3. The semiconductor package according to claim 1, further comprising a fifth semiconductor chip above the fourth semiconductor chip, the fifth semiconductor chip sealed in the second mold member; and wherein:

an edge of the first semiconductor chip, an edge of the third semiconductor chip, an edge of the fourth semiconductor chip, and an edge of the fifth semiconductor chip are not aligned;

the edge of the third semiconductor chip is shifted from the edge of the first semiconductor chip in a third direction;

the edge of the fourth semiconductor chip is shifted from the edge of the third semiconductor chip in the third direction; and the edge of the fifth semiconductor chip is shifted from the edge of the fourth semiconductor chip in the third direction.

4. The semiconductor package according to claim 1, further comprising a fifth semiconductor chip above the fourth semiconductor chip, a sixth semiconductor chip above the fifth semiconductor chip; and wherein:

the fifth semiconductor chip and the sixth semiconductor chip are sealed in the second mold member;

an edge of the first semiconductor chip, an edge of the third semiconductor chip, an edge of the fourth semiconductor chip, an edge of the fifth semiconductor chip, and an edge of the sixth semiconductor chip are not aligned;

the edge of the third semiconductor chip is shifted from the edge of the first semiconductor chip in a third direction;

the edge of the fourth semiconductor chip is shifted from the edge of the third semiconductor chip in a fourth direction, the fourth direction opposing the third direction;

the edge of the fifth semiconductor chip is shifted from the edge of the fourth semiconductor chip in the third direction; and the edge of the sixth semiconductor chip is shifted from the edge of the fifth semiconductor chip in the fourth direction.

5. The semiconductor package according to claim 1, further comprising:

a first mold package comprising:
the first semiconductor chip above the substrate,
the second semiconductor chip,
the first wire group, and
the first mold member; and a second mold package comprising:
the third semiconductor chip,
the fourth semiconductor chip,
the second wire group, and
the second mold member.

6. The semiconductor package according to claim 1, wherein the high-speed interface standards comprises Serial Advanced Technology Attachment (SATA), Serial Attached Small computer system interface (SAS), or Peripheral Component Interconnect express (PCIe).

7. A semiconductor package comprising:

a substrate comprising a first pad group and a second pad group;

a first semiconductor chip above the substrate;

a first wire group configured to electrically connect the first pad group and the first semiconductor chip;

a first mold member configured to seal the first wire group and the first semiconductor chip;

a second semiconductor chip above the first mold member;

a second wire group configured to electrically connect the second pad group and the second semiconductor chip; and a second mold member configured to seal the second wire group, the second semiconductor chip, and the first mold member; wherein:

the first semiconductor chip comprises four sides connected to the first wire group;

the four sides comprises at least a first side and a second side;

the first wire group comprises first wires and second wires;

the first wires are connected to the first side of the first semiconductor chip and transmit a signal between the substrate and the controller via high-speed interface standards;

the second wires are connected to the second side of the first semiconductor chip and extends in a same direction as the second wire group; and the first wires and the second wire group are configured not to overlap each other when viewed from a top view.

8. The semiconductor package according to claim 7, wherein:

the second semiconductor chip comprises a nonvolatile memory, and the first semiconductor chip comprises a controller of the nonvolatile memory.

9. The semiconductor package according to claim 8, further comprising:

a third semiconductor chip above the substrate; and a third wire group configured to electrically connect the third semiconductor chip and a third pad group above the substrate; wherein:

the third semiconductor chip and the third wire group are sealed in the first mold member, and the third semiconductor chip comprises a dynamic random access memory.

10. The semiconductor package according to claim 9, further comprising an electronic component above the substrate, the electronic component being sealed in the second mold member.

11. The semiconductor package according to claim 8, further comprising:

a sixth semiconductor chip above the substrate; and a third wire group configured to electrically connect the sixth semiconductor chip and a third pad group above the substrate; wherein:

the sixth semiconductor chip and the third wire group are sealed in the second mold member, and the sixth semiconductor chip comprises a dynamic random access memory.

12. The semiconductor package according to claim 11, further comprising an electronic component above the substrate, the electronic component being sealed in the second mold member.

13. The semiconductor package according to claim 8, further comprising:
   a first mold package comprising:
      the first semiconductor chip,
      the first wire group, and
      the first mold member; and
   a second mold package comprising:
      the second semiconductor chip,
      the third semiconductor chip,
      the fourth semiconductor chip,
      the fifth semiconductor chip,
      the second wire group, and
      the second mold member.

14. The semiconductor package according to claim 7, wherein the high-speed interface standards comprises Serial Advanced Technology Attachment (SATA), Serial Attached Small computer system interface (SAS), or Peripheral Component Interconnect express (PCIe).

* * * * *